United States Patent
Yeh et al.

(10) Patent No.: US 8,729,791 B1
(45) Date of Patent: May 20, 2014

(54) PHOSPHOR, AND LIGHT EMITTING DEVICE EMPLOYING THE SAME

(71) Applicant: Industrial Technology Research Institute, Hsinchu (TW)

(72) Inventors: Yao-Tsung Yeh, Taoyuan (TW); Yi-Chen Chiu, Hsinchu (TW); Chien-Hao Huang, Dongshi Township, Yunli County (TW); Shyue-Ming Jang, Hsinchu (TW); Wei-Jen Liu, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/910,539

(22) Filed: Jun. 5, 2013

(30) Foreign Application Priority Data

Dec. 13, 2012 (TW) .............................. 101147089 A (51) Int. Cl.
*H01J 1/62* (2006.01)
*H01J 63/04* (2006.01)

(52) U.S. Cl.
USPC ..................................... 313/503; 252/301.4 F (58) Field of Classification Search
USPC ................. 313/483, 486, 496, 502, 503, 582; 257/98; 252/301.4 F, 301.4 R
See application file for complete search history.

(56) References Cited

U.S. PATENT DOCUMENTS

| | | | |
|---|---|---|---|
| 6,649,946 B2 | 11/2003 | Bogner et al. | |
| 6,682,663 B2 | 1/2004 | Botty et al. | |
| 6,724,142 B2 | 4/2004 | Ellens et al. | |
| 7,258,816 B2 | 8/2007 | Tamaki et al. | |
| 7,297,293 B2 | 11/2007 | Tamaki et al. | |
| 7,537,710 B2 | 5/2009 | Oshio | |
| 7,544,309 B2 | 6/2009 | Juestel et al. | |
| 7,597,823 B2 | 10/2009 | Tamaki et al. | |
| 7,642,708 B2 | 1/2010 | Juestel et al. | |
| 7,700,002 B2 | 4/2010 | Schmidt et al. | |
| 7,713,443 B2 | 5/2010 | Hirosaki et al. | |
| 7,906,040 B2 | 3/2011 | Mitomo et al. | |
| 7,964,113 B2 | 6/2011 | Tamaki et al. | |
| 8,017,035 B2 | 9/2011 | Wang et al. | |
| 8,193,696 B2 | 6/2012 | Kim et al. | |
| 2005/0200271 A1 | 9/2005 | Juestel et al. | |
| 2006/0017041 A1 | 1/2006 | Tian et al. | |
| 2007/0252513 A1 | 11/2007 | Justel et al. | |

(Continued)

FOREIGN PATENT DOCUMENTS

TW 201113351 4/2011
WO WO 2004055910 A1 * 7/2004

OTHER PUBLICATIONS

EIC Search Report 2800. Search for Phosphor in claims 1-6 of U.S. Appl. No. 13/910,539. Mar. 6, 2014.*

(Continued)

*Primary Examiner* — Nimeshkumar Patel
*Assistant Examiner* — Glenn Zimmerman
(74) *Attorney, Agent, or Firm* — Muncy, Geissler, Olds & Lowe, P.C.

(57) ABSTRACT

The disclosure provides a phosphor composed of $(M^1{}_a La_b Eu_c)_2 Si_{5-x}(B_d M^2{}_e)_x N_{8-x} O_x$, wherein $M^1$ is Ca, Sr, or combinations thereof. $M^2$ is Ga, In, or combinations thereof. $0<a<1.00$, $0 \le b<0.05$, $0<c\le 0.04$, and $a+b+c=1.00$, $0\le d\le 1.00$, $0\le e\le 1.00$, $d+e=1.00$, and $b+d\ne 0$, and $0.001<x<0.60$. Under excitation, the phosphor of the disclosure emits visible light and may be collocated with other phosphors to provide a white light illumination device.

10 Claims, 4 Drawing Sheets

(56) References Cited

U.S. PATENT DOCUMENTS

| | | | |
|---|---|---|---|
| 2008/0001126 A1 | 1/2008 | Hirosaki | |
| 2008/0197321 A1 | 8/2008 | Hirosaki et al. | |
| 2009/0283721 A1 | 11/2009 | Liu et al. | |
| 2009/0284948 A1 | 11/2009 | Yamao et al. | |
| 2009/0294788 A1* | 12/2009 | Rosler et al. | 257/98 |
| 2010/0264809 A1 | 10/2010 | Winkler et al. | |
| 2010/0283076 A1 | 11/2010 | Winkler et al. | |
| 2011/0062469 A1* | 3/2011 | Camras et al. | 257/98 |
| 2011/0090683 A1 | 4/2011 | Petry et al. | |
| 2012/0091879 A1 | 4/2012 | Juang et al. | |

OTHER PUBLICATIONS

Hoppe et. al., "Luminescence in $Eu^{2+}$-doped $Ba_2Si_5N_8$: fluorescence, thermoluminescence, and upconversion", Elsevier, Journal of Physics and Chemistry of Solids, 2000, pp. 2001-2006, vol. 61.

Fang et al., "Electronic structure of the alkaline-earth silicon nitrides $M_2Si_5N_8$ (M=Ca and SR) obtained from first-principles calculations and optical reflectance spectra", Journal of Physics: Condense Matter, 2001, pp. 67-76, vol. 13.

Xie et al., "A Simple, Efficient Synthetic Route to $Sr_2Si_5N_8$: $Eu^{2+}$-Based Red Phosphors for White Light-Emitting Dioes", Chem. Mater., 2006, pp. 5578-5583, vol. 18.

Piao et al., "Characterization and luminescence properties of $Sr_2Si_5N_8$: $Eu^{2+}$ phosphor for white light-emitting-diode illumination", Applied Physics Letters, 2006, pp. 161908-1-161908-3, vol. 88.

Li et al., "Luminescence properties of red-emitting $M_2Si_5N_8$: $Eu^{2+}$(M=Ca, Sr, Ba) LED conversion phosphors", Elsevier, Journal of Alloys and Compounds, 2006, pp. 273-279, vol. 417.

\* cited by examiner

PHOSPHOR, AND LIGHT EMITTING DEVICE EMPLOYING THE SAME

CROSS REFERENCE TO RELATED APPLICATIONS

This application is based upon and claims the benefit of priority from the prior Taiwan Patent Application No. 101147089, filed on Dec. 13, 2012, the entire contents of which are incorporated herein by reference.

TECHNICAL FIELD

The disclosure relates to a phosphor and a light emitting device employing the same and, more particularly, to an oxynitride phosphor and a light emitting device employing the same.

BACKGROUND

Conventional tungsten lamps or fluorescent lamps of white light illumination devices have been gradually replaced by commercially available light emitting diodes (herein after LEDs). Advantages of LEDs are as follows: (1) the small size of LEDs make them suitable to be illumination devices of array packages and collocated with different colors, if necessary; (2) LEDs have relatively long operating life spans of more than 10,000 hours, which is 50 times that of conventional tungsten lamps; (3) LEDs have shock resistance and are durable due to transparent resin applied as a packaging resin; (4) LEDs are environmentally friendly as the interior structures are free of mercury; (5) LEDs consume ⅓ to ⅕ less power than that of the conventional tungsten lamp.

Conventional white light illumination devices achieve a white emission by yellow YAG phosphor excited by a blue LED (with a wavelength of 450±20 nm). The described two-wavelength (blue and yellow) white LED has many illumination limitations due to the high color temperatures and uneven colors. Therefore, color quality is less than desired. Also, color control of the white light is difficult due to the blue light wavelength from the LED chip changing along with different temperatures thereof. In addition, the two-wavelength white light lacks red light, thereby reducing color rendering thereof.

Therefore, it is necessary to develop a novel red phosphor suitable for use in a white light illumination device to increase the color rendering index thereof.

BRIEF SUMMARY

An exemplary embodiment of the disclosure provides an oxynitride phosphor, having a formula: $(M^1{}_a La_b Eu_c)_2 Si_{5-x}(B_d M^2{}_e)_x N_{8-x} O_x$, wherein $M^1$ is Ca, Sr, or combinations thereof, and $M^2$ is Ga, In, or combinations thereof, $0<a<1.00$, $0\le b<0.05$, $0<c\le 0.04$, and $a+b+c=1.00$, $0\le d\le 1.00$, $0\le e\le 1.00$, and $d+e=1.00$, $b+d\ne 0.00$, and $0.001<x<0.60$.

Another exemplary embodiment of the disclosure provides a light emitting device including: an excitation light source; and the aforementioned oxynitride phosphor.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The disclosure provides an oxynitride phosphor, having a formula: $(M^1{}_a La_b Eu_c)_2 Si_{5-x}(B_d M^2{}_e)_x N_{8-x} O_x$, wherein $M^1$ is Ca, Sr, or combinations thereof, and $M^2$ is Ga, In, or combinations thereof, $0<a<1.00$, $0\le b<0.05$, $0<c\le 0.04$, and $a+b+c=1.00$, $0\le d\le 1.00$, $0\le e\le 1.00$, and $d+e=1.00$, $b+d\ne 0.00$, and $0.001<x<0.60$.

According to embodiments of the disclosure, since the sum of b and d has to be more than 0, the oxynitride phosphor includes at least one element of La and B, and the oxynitride phosphor includes at least one element of B, Ga, and In.

According to an embodiment of the disclosure, since $M^1$ can be Ca alone, the oxynitride phosphor can be $(Ca_a Eu_c)_2 Si_{5-x}(B_d M^2{}_e)_x N_{8-x} O_x$, or $(Ca_a La_b Eu_c)_2 Si_{5-x}(B_d M^2{}_e)_x N_{8-x} O_x$. Further, since $M^1$ can be Sr alone, the oxynitride phosphor can be $(Sr_a Eu_c)_2 Si_{5-x}(B_d M^2{}_e)_x N_{8-x} O_x$, or $(Sr_a La_b Eu_c)_2 Si_{5-x}(B_d M^2{}_e)_x N_{8-x} O_x$. According to other embodiments of the disclosure, d is larger than 0, when $M^1$ is Ca or Sr. According to embodiments of the disclosure, since $M^1$ can include Sr and Ca simultaneously, and the oxynitride phosphor can be $((Ca_{1-y}Sr_y)_a Eu_c)_2 Si_{5-x}(B_d M^2{}_e)_x N_{8-x} O_x$, or $((Ca_{1-y}Sr_y)_a La_b Eu_c)_2 Si_{5-x}(B_d M^2{}_e)_x N_{8-x} O_x$, wherein $0<y<1$, such as $0.001\le y\le 0.1$, $0.1\le y\le 0.2$, $0.2\le y\le 0.3$, $0.3\le y\le 0.4$, $0.4\le y\le 0.5$, $0.5\le y\le 0.6$, $0.6\le y\le 0.7$, $0.7\le y\le 0.8$, $08\le y\le 0.9$, or $0.9\le y\le 0.999$.

According to embodiments of the disclosure since $M^2$ can be Ga or In, the oxynitride phosphor can be $(M^1{}_a La_b Eu_c)_2 Si_{5-x}(B_d Ga_e)_x N_{5-x} O_x$, $(M^1{}_a La_b Eu_c)_2 Si_{5-x}(B_d In_e)_x N_{8-x} O_x$, or $(M^1{}_a La_b Eu_c)_2 Si_{5-x}(B_d(Ga_y In_{1-y})_e)_x N_{8-x} O_x$, wherein y is as defined above.

According to embodiments of the disclosure, since the sum of b and d has to be larger than 0, the oxynitride phosphor can be $(M^1{}_a La_b Eu_c)_2 Si_{5-x}(M^2{}_e)_x N_{8-x} O_x$, or $(M^1{}_a Eu_c)_2 Si_{5-x}(B_d M^2{}_e)_x N_{8-x} O_x$.

According to embodiments of the disclosure, the oxynitride phosphor of the disclosure can be $((Ca_y Sr_{1-y})_a La_b Eu_c)_2 Si_{4.99} In_{0.01} N_{7.99} O_{0.01}$.

According to some embodiments of the disclosure, x is defined as: $0.001\le x\le 0.1$, $0.1\le x\le 0.2$, $0.2\le x\le 0.3$, $0.3\le x\le 0.4$, $0.4\le x\le 0.5$, or $0.5\le x\le 0.6$, a is defined as: $0.001\le a\le 0.1$, $0.1\le a\le 0.2$, $0.2\le a\le 0.3$, $0.3\le a\le 0.4$, $0.4\le a\le 0.5$, $0.5\le a\le 0.6$, $0.6\le a\le 0.7$, $0.7\le a\le 0.8$, $0.8\le a\le 0.9$, or $0.9\le a\le 0.999$, when b is larger than 0, b can be defined as: $0.001\le b\le 0.1$, $0.1\le b\le 0.2$, $0.2\le b\le 0.3$, $0.3\le b\le 0.4$, $0.4\le b\le 0.049$; c is defined as: $0.001\le c\le 0.1$, $0.1\le c\le 0.2$, $0.2\le c\le 0.3$, or $0.3\le c\le 0.4$; when d is larger than 0, d can be defined as: $0.001\le d\le 0.1$, $0.1\le d\le 0.2$, $0.2\le d\le 0.3$, $0.3\le d\le 0.4$, $0.4\le d\le 0.5$, $0.5\le d\le 0.6$, $0.6\le d\le 0.7$, $0.7\le d\le 0.8$, $0.8\le d\le 0.9$, or $0.9\le d\le 1$, and, when e is larger than 0, e can be defined as: $0.001\le e\le 0.1$, $0.1\le e\le 0.2$, $0.2\le e\le 0.3$, $0.3\le e\le 0.4$, $0.4\le e\le 0.5$, $0.5\le e\le 0.6$, $0.6\le e\le 0.7$, $0.7\le e\le 0.8$, $0.8\le e\le 0.9$, or $0.9\le e\le 1$. The oxynitride phosphor of the disclosure can be excited by a light with a wavelength of between 200-500 nm to emit a light with a major emission peak of between 550-750 nm.

The method for preparing the oxynitride phosphor of the disclosure can include the following steps. First, a mixture is provided, wherein the mixture includes the following components: (1) $M^1$-containing oxide or $M^1$ containing nitride; (2) europium oxide, or europium chloride; (3) lanthanum oxide (such as $La_2O_3$); and (4) silicon nitride (such as $Si_3N_4$).

Further, the mixture can further include (5) $M^2$-containing oxide or $M^2$-containing nitride. Next, the mixture is sintered under a reductive atmosphere.

The step of sintering the mixture can have a sintering temperature of between 800-1000° C., and the mixture can be sintered at the sintering temperature for 0.5-32 hrs (such as 8 hrs). According to embodiments of the disclosure, the (1) $M^1$-containing oxide or $M^1$-containing nitride can include Ca-containing oxide or Ca-containing nitride, Sr-containing oxide or Sr-containing nitride, or combinations thereof, and, (5) $M^2$-containing oxide or $M^2$-containing nitride can include Ga-containing oxide or Ga-containing nitride, In-containing oxide or In-containing nitride, or combinations thereof. Further, the reductive atmosphere includes hydrogen gas and a carrier gas such inert gas.

According to embodiments of the invention, a light emitting device is also provided, including an excitation light source and the aforementioned phosphor. The excitation light source (configured to emit a radiation having a wavelength ranging from about 200 to 500 nm) can include a light emitting diode (LED), a laser diode (LD), an organic light emitting diode (OLED), cold cathode fluorescent lamp (CCFL), external electrode fluorescent lamp (EEFL), or vacuum ultra violet (VUV).

The light emitting device can be a white light emitting device. Since the phosphors of the invention can be red phosphors, the white light emitting device employing the aforementioned phosphors of the invention may employ a blue phosphor or green phosphor.

The blue phosphor can be any conventional blue phosphor, such as $BaMgAl_{10}O_{17}:Eu^{2+}$, or $ZnS:Ag,Cl$. The green phosphor can be any conventional green phosphor, such as $BaMgAl_{10}O_{17}:Eu^{2+},Mn^{2+}$(BAM-Mn), $SrSi_2N_2O_2:Eu^{2+}$, $CaSc_2O_4:Ce^{3+}$, $Ca_3Sc_2Si_3O_{12}:Ce^{3+}$, $(Ca_iSr_jBa_{1-i-j})_4Al_{14}O_{25}:Eu^{2+}$, $Ca_8Mg(SiO_4)_4Cl_2:Eu^{2+}$, $Ca_8Mg(SiO_4)_4Cl_2:Mn^{2+}$, or $(Ba_iSr_{1-i})_2SiO_4:Eu^{2+}$, wherein $0 \le i \le 1$, and $0 \le j \le 1$. The light emitting device can serve as a pilot device (such as traffic sign, and pilot lamp of an instrument), a back light source (such as back light of an instrument and display), or a lighting fitting (such as a bias light, traffic sign, or signboard).

Figure 1:
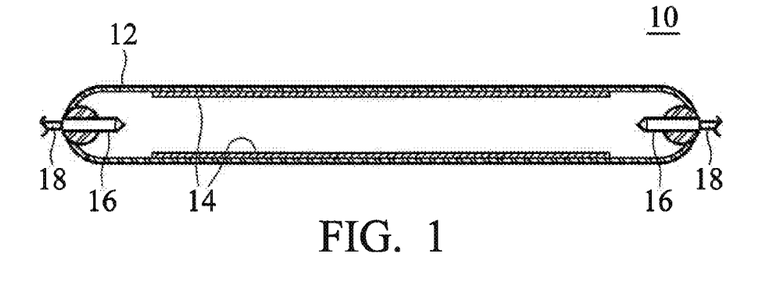
FIG. 1 is a cross section of a light emitting device according to an embodiment of the disclosure.

According to an embodiment of the invention, referring to FIG. 1, the light emitting device 10 comprises a lamp tube 12, a phosphor disposed on the inside walls of the lamp tube 12, an excitation light source 16, and electrodes 18 disposed on each of the two ends of the lamp tube 12. Further, the lamp tube 12 of the light emitting device 10 can further include Hg and an inert gas. The phosphor 14 can include the oxynitride phosphor of the invention. Moreover, the phosphor 14 can further include a blue phosphor, or a green phosphor for generating white-light radiation. The light emitting device 10 can serve as a back light source of a liquid crystal display.

Figure 2:
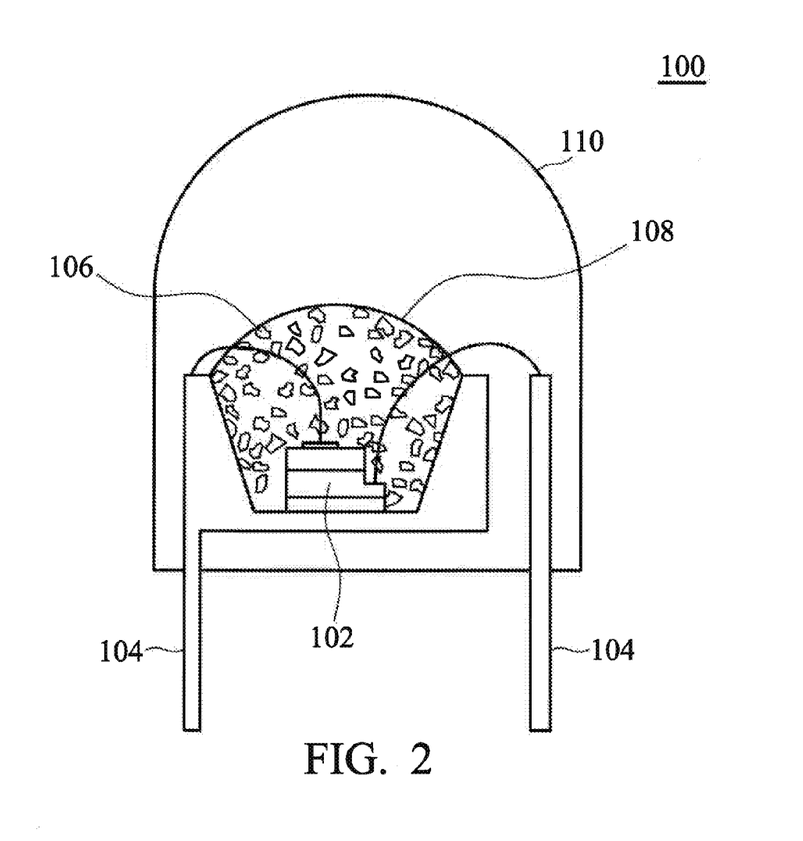
FIG. 2 is a cross section of a light emitting device according to another embodiment of the disclosure.
Figure 3:
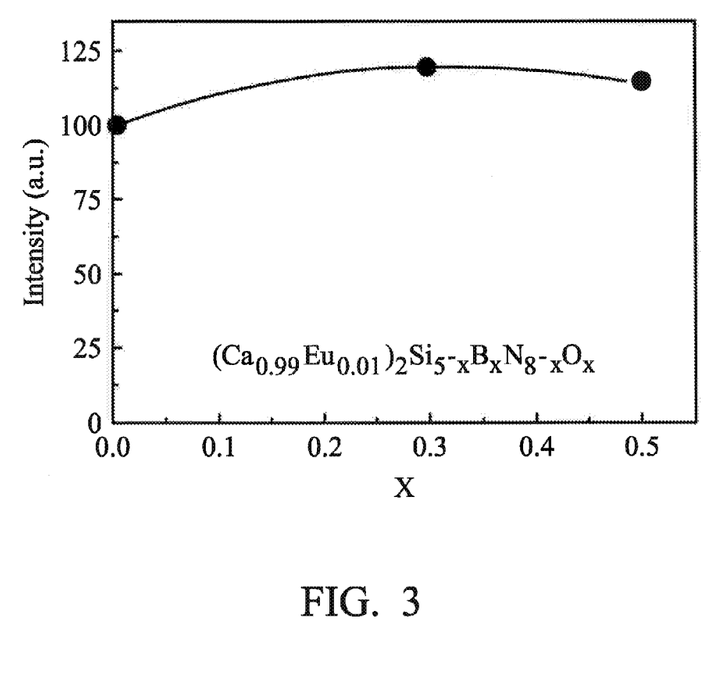
FIG. 3 shows the relative emission intensity of the phosphors as disclosed in Examples 3 and 4.

According to another embodiment of the invention, referring to FIG. 2, the light emitting device 100 employs a light emitting diode or laser diode 102 as an excitation light source, and the light emitting diode or laser diode 102 are disposed on a lead frame 104. A transparent resin 108 mixed with a phosphor 106 is coated on and covers the light emitting diode or laser diode 102. A sealing material 110 is used to encapsulate the light emitting diode or laser diode 102, the lead frame 104, and the transparent resin 108 together.

The following examples are intended to illustrate the invention more fully without limiting their scope, since numerous modifications and variations will be apparent to those skilled in this art.

Preparation of the Phosphor Having a Formula of $(Ca_{0.99}Eu_{0.01})_2Si_{5-x}B_xN_{8-x}O_x$ Example 1

0.1223 g of $Ca_3N_2$ (FW=148.25, commercially available from ALDRICH), 0.2923 g of $\alpha$-$Si_3N_4$(FW=140.29, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.99}Eu_{0.01})_2Si_5N_8$. The excitation wavelength, emission wavelength, and relative emission intensity (set as 100) of the described product were measured and the results are shown in Table 1.

Example 2

0.1223 g of $Ca_3N_2$ (FW=148.25, commercially available from ALDRICH), 0.2865 g of $\alpha$-$Si_3N_4$ (FW=140.29, commercially available from ALDRICH), 0.0022 g of $B_2O_3$ (FW=69.62, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.99}Eu_{0.01})_2Si_{4.9}B_{0.1}N_{7.9}O_{0.1}$.

Example 3

0.1223 g of $Ca_3N_2$ (FW=148.25, commercially available from ALDRICH), 0.2748 g of $\alpha$-$Si_3N_4$ (FW=140.29, commercially available from ALDRICH), 0.0066 g of $B_2O_3$ (FW=69.62, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.99}Eu_{0.01})_2Si_{4.7}B_7B_{0.3}N_{7.7}O_{0.3}$.

Next, the emission wavelength, and relative emission intensity (in comparison with the phosphor of Example 1) of the described product were measured and the results are shown in Table 1.

Example 4

0.1223 g of $Ca_3N_2$ (FW=148.25, commercially available from ALDRICH), 0.2631 g of $\alpha$-$Si_3N_4$ (FW=140.29, commercially available from ALDRICH), 0.0110 g of $B_2O_3$ (FW=69.62, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.99}Eu_{0.01})_2Si_{4.5}B_{0.5}N_{7.5}O_{0.5}$.

Next, the emission wavelength, and relative emission intensity (in comparison with the phosphor of Example 1) of the described product were measured and the results are shown in Table 1.

TABLE 1

|  | relative emission intensity |
|---|---|
| Example 1 | 100 |
| Example 3 | 115 |
| Example 4 | 111 |

As shown in Table 1, the phosphors can have improved emission intensity when replacing $Si_3N_4$ with $B_2O_3$ as a starting material of the phosphors. Further, the phosphor with a formula of $(Ca_{0.99}Eu_{0.01})_2Si_{4.7}B_{0.3}N_{7.7}O_{0.3}$ (disclosed in Example 3) exhibited optimal emission strength, as shown in Table 1.

Preparation of the Phosphor Having a Formula of $(Sr_{0.99}Eu_{0.01})_2Si_{5-x}B_xN_{8-x}O_x$

Example 5

0.2400 g of $Sr_3N_2$ (FW=290.87, commercially available from CERAC), 0.2631 g of $\alpha$-$Si_3N_4$ (FW=140.29, commercially available from ALDRICH), 0.0110 g of $B_2O_3$ (FW=69.62, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Sr_{0.99}Eu_{0.01})_2B_{0.05}Si_{4.95}N_{7.95}O_{0.05}$.

Figure 4:
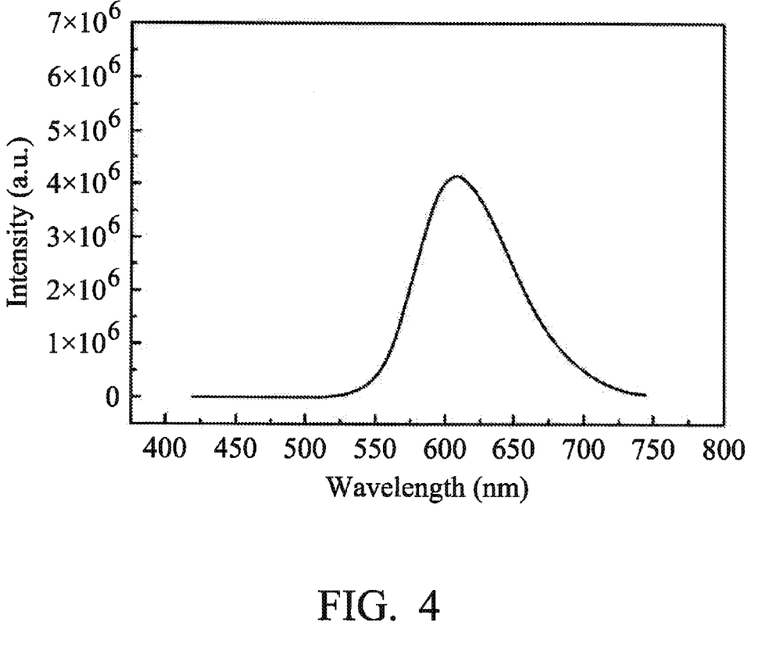
FIG. 4 shows a photoluminescence spectrum of the phosphor as disclosed in Example 5.

Next, the emission wavelength, and emission intensity of the described product were measured and the results are shown in FIG. 4.

Example 6

0.2400 g of $Sr_3N_2$ (FW=290.87, commercially available from CERAC), 0.2777 g of $\alpha$-$Si_3N_4$ (FW=140.29, commercially available from ALDRICH), 0.0055 g of $B_2O_3$ (FW=69.62, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Sr_{0.99}Eu_{0.01})_2B_{0.25}Si_{4.75}N_{7.75}O_{0.25}$.

Figure 5:
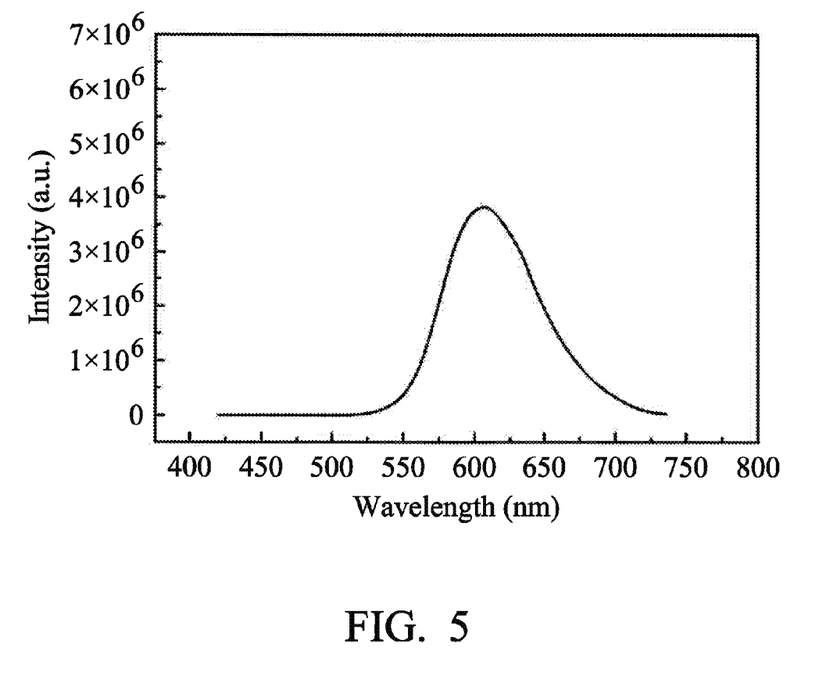
FIG. 5 shows a photoluminescence spectrum of the phosphor as disclosed in Example 6.

Next, the emission wavelength, and emission intensity of the described product were measured and the results are shown in FIG. 5.

Preparation of the Phosphor Having a Formula of $(Ca_{0.1}Sr_{0.89-b}La_bEu_{0.01})_2Si_{4.99}In_{0.01}N_{7.99}O_{0.01}$

Example 7

0.0124 g of $Ca_3N_2$ (FW=148.25, commercially available from ALDRICH), 0.2157 g of $Sr_3N_2$ (FW=290.87, commercially available from CERAC), 0.2917 g of $\alpha$-$Si_3N_4$ (FW=140.29, commercially available from ALDRICH), 0.0017 g of $In_2O_3$ (FW=277.64, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C. /min. After sintering at 1400° C. for 8 hours under 15% $H_2$/85% $N_2$, washing, filtering, and heat drying processes were performed, to obtain a pure phase of the oxynitride phosphor $(Ca_{0.1}Sr_{0.89}Eu_{0.01})_2Si_{4.99}In_{x0.01}N_{7.99}O_{0.01}$.

Next, the emission wavelength, and relative emission intensity (set as 100) of the described product were measured and the results are shown in Table 2.

Example 8

0.0122 g of $La_2O_3$ (FW=325.81, commercially available from ALDRICH), 0.0125 g of $Ca_3N_2$ (FW=148.25, commercially available from ALDRICH), 0.2085 g of $Sr_3N_2$ (FW=290.87, commercially available from CERAC), 0.2916 g of $\alpha$-$Si_3N_4$ (FW=140.29, commercially available from ALDRICH), 0.0017 g of $In_2O_3$ (FW=277.64, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.1}Sr_{0.86}La_{0.03}Eu_{0.01})_2Si_{4.99}In_{x0.01}N_{7.99}O_{0.01}$.

Example 9

0.0041 g of $La_2O_3$ (FW=325.81, commercially available from ALDRICH), 0.0124 g of $Ca_3N_2$ (FW=148.25, commercially available from ALDRICH), 0.2133 g of $Sr_3N_2$ (FW=290.87, commercially available from CERAC), 0.2916 g of $\alpha$-$Si_3N_4$ (FW=140.29, commercially available from ALDRICH), 0.0017 g of $In_2O_3$ (FW=277.64, commercially available from ALDRICH), and 0.0056 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.1}Sr_{0.88}La_{0.01}Eu_{0.01})_2Si_{4.99}In_{x0.01}N_{7.99}O_{0.01}$.

Next, the emission wavelength, and relative emission intensity (in comparison with the phosphor of Example 7) of the described product were measured and the results are shown in Table 2.

TABLE 2

| | relative emission intensity |
|---|---|
| Example 7 | 100 |
| Example 9 | 125 |

As shown in Table 2, the phosphors can have improved emission intensity when replacing Sr with La of the formula.

Preparation of the Phosphor Having a Formula of $(Ca_{0.1}Sr_{0.87}La_{0.01}Eu_{0.02})_2Si_{4.99}In_{0.81}N_{7.99}O_{0.01}$

Example 10

0.0081 g of $La_2O_3$ (FW=325.81, commercially available from ALDRICH), 0.0124 g of $Ca_3N_2$ (FW=148.25, commercially available from ALDRICH), 0.2109 g of $Sr_3N_2$ (FW=290.87, commercially available from CERAC), 0.2917 g of α-$Si_3N_4$ (FW=140.29, commercially available from ALDRICH), 0.0017 g of $In_2O_3$ (FW=277.64, commercially available from ALDRICH), and 0.0111 g of $EuCl_2$ (FW=222.87, commercially available from ALDRICH) were weighted, evenly mixed and ground, and charged in an alumina crucible. The alumina crucible was then heated in a high temperature furnace to 1400° C. with a rate of 5° C./min. After sintering at 1400° C. for 8 hours under 15% $H_2$/85% $N_2$, washing, filtering, and heat drying processes were performed, to obtain a pure phase of the oxynitride phosphor $(Ca_{0.1}Sr_{0.87}La_{0.01}Eu_{0.02})_2Si_{4.99}In_{0.01}N_{7.99}O_{0.01}$.

Next, the internal quantum efficiency and external quantum efficiency of the oxynitride phosphor $(Ca_{0.1}Sr_{0.87}La_{0.01}Eu_{0.02})_2Si_{4.99}In_{0.01}N_{7.99}O_{0.01}$ were measured, and compared with a commercial red phosphor (having a formula of $Sr_2Si_5N_8$:$Eu^{2+}$, sold and manufactured by Beijing Nakamura-Yuji Science and Technology Co. Ltd. with a trade No. ZYP-630). The results are shown in Table 3.

TABLE 3

| | internal quantum efficiency | external quantum efficiency |
|---|---|---|
| ZYP-630 | 72.8% | 58.82% |
| Example 10 | 83.8% | 60.84% |

As shown in Table 3, in comparison with the commercial red phosphor, the red phosphor of Example 10 had high internal quantum efficiency and external quantum efficiency.

Light Emitting Devices

Example 11

A near-UV light-emitting diode (having a wavelength of 405 nm), a blue phosphor (having a formula of $Ca_2(PO_4)Cl$:$Eu^{2+}$, manufactured by ITRI with a No. CAP), a green phosphor (having a formula of $Ba_2SiO_4$:$Eu^{2+}$, sold and manufactured by Intematix with a trade No. BOS-507), and the oxynitride phosphor (having a formula of $(Ca_{0.1}Sr_{0.87}La_{0.01}Eu_{0.02})_2Si_{4.99}In_{0.01}N_{7.99}O_{0.01}$) of Example 10 were arranged to form a white light emitting device.

Next, the near-UV light-emitting diode was driven, and the correlated color temperature (CCT), color rendering index (CRI), and the C.I.E. coordinates of the white light emitting device were measured. The results are shown in Table 4.

Example 12

A near-UV light-emitting diode (having a wavelength of 405 nm), a blue phosphor (having a formula of $Ca_2(PO_4)Cl$:$Eu^{2+}$, manufactured by ITRI with a No. CAP), a green phosphor (having a formula of $Ba_2SiO_4$:$Eu^{2+}$, sold and manufactured by Intematix with a trade No. BOS-507), and the commercial red phosphor (having a formula of $Sr_2Si_5N_8$:$Eu^{2+}$, sold and manufactured by Beijing Nakamura-Yuji Science and Technology Co. Ltd. with a trade No. ZYP-630) were arranged to form a white light emitting device.

Next, the near-UV light-emitting diode was driven, and the correlated color temperature (CCT), color rendering index (CRI), and the C.I.E. coordinates of the white light emitting device were measured. The results are shown in Table 4.

TABLE 4

| | Example 11 | Example 12 |
|---|---|---|
| C.I.E coordinate | (0.34, 0.35) | (0.34, 0.35) |
| correlated color temperature (° C.) | 5181 | 5010 |
| color rendering index | 97 | 97 |

As shown in Table 4, the phosphors of the disclosure can be applied in a white light LED to improve the color rendering index and correlated color temperature thereof.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor, having a formula:

wherein $M^1$ is Ca, Sr, or combinations thereof, and $M^2$ is Ga, In, or combinations thereof, $0<a<1.00$, $0≤b<0.05$, $0<c≤0.04$, and $a+b+c=1.00$, $0≤d≤1.00$, $0≤e≤1.00$, and $d+e=1.00$, $b+d≠0.00$, and $0.001<x<0.60$.

2. The phosphor as claimed in claim 1, wherein the phosphor comprises $(Ca_aEu_c)_2Si_{5-x}(B_dM^2_e)_xN_{8-x}O_x$, or $(Ca_aLa_bEu_c)_2Si_{5-x}(B_dM^2_e)_xN_{8-x}O_x$, wherein $0<a<1.00$, $0≤b<0.05$, $0<c≤0.04$, and $a+b+c=1.00$, $0≤d≤1.00$, $0≤e≤1.00$, and $d+e=1.00$, $b+d≠0.00$, and, $0.001<x<0.60$.

3. The phosphor as claimed in claim 1, wherein the phosphor comprises $(Sr_aEu_c)_2Si_{5-x}(B_dM^2_e)_xN_{8-x}O_x$, or $(Sr_aLa_bEu_c)_2Si_{5-x}(B_dM^2_e)_xN_{8-x}O_x$, wherein $0<a<1.00$, $0≤b<0.05$, $0<c≤0.04$, and $a+b+c=1.00$, $0≤d≤1.00$, $0≤e≤1.00$, and $d+e=1.00$, $b+d≠0.00$, and, $0.001<x<0.60$.

4. The phosphor as claimed in claim 1, wherein the phosphor comprises $((Ca_{1-y}Sr_y)_aEu_c)_2Si_{5-x}(B_dM^2_e)_xN_{8-x}O_x$, or $((Ca_{1-y}Sr_y)_aLa_bEu_c)_2Si_{5-x}(B_dM^2_e)_xN_{8-x}O_x$, wherein $0<a<1.00$, $0≤b<0.05$, $0<c≤0.04$, and $a+b+c=1.00$, $0≤d≤1.00$, $0≤e≤1.00$, and $d+e=1.00$, $b+d≠0.00$, and, $0.001<x<0.60$, and $0<y<1$.

5. The phosphor as claimed in claim 1, wherein the phosphor comprises $(M^1_aLa_bEu_c)_2Si_{5-x}(B_dGa_e)_xN_{8-x}O_x$, $(M^1_aLa_bEu_c)_2Si_{5-x}(B_dIn_e)_xN_{8-x}O_x$, or $(M^1_aLa_bEu_c)_2Si_{5-x}(B_d(Ga_yIn_{1-y})_e)_xN_{8-x}O_x$, wherein $0<a<1.00$, $0≤b<0.05$, $0<c≤0.04$, and $a+b+c=1.00$, $0≤d≤1.00$, $0≤e≤1.00$, and $d+e=1.00$, $b+d≠0.00$, and, $0.001<x<0.60$, and $0<y<1$.

6. The phosphor as claimed in claim 1, wherein the phosphor comprises $(M^1_aLa_bEu_c)_2Si_{5-x}(M^2_e)_xN_{8-x}O_x$, or $(M^1{}_a Eu_c)_2 Si_{5-x}(B_d M^2{}_e)_x N_{8-x} O_x$, wherein $0<a<1.00$, $0 \leq b<0.05$, $0<c \leq 0.04$, and $a+b+c=1.00$, $0 \leq d \leq 1.00$, $0 \leq e \leq 1.00$, and $d+e=1.00$, $b+d \neq 0.00$, and, $0.001<x<0.60$.

7. The phosphor as claimed in claim 1, wherein the phosphor is excited by a light with a wavelength of between 200-500 nm to emit a light with a major emission peak of between 550-750 nm.

8. A light emitting device, comprising:
an excitation light source; and
the phosphor as claimed in claim 1.

9. The light emitting device as claimed in claim 8, wherein the excitation light source comprises a light emitting diode (LED), a laser diode (LD), an organic light emitting diode (OLED), cold cathode fluorescent lamp (CCFL), external electrode fluorescent lamp (EEFL), or vacuum ultra violet (VUV).

10. The light emitting device as claimed in claim 8, wherein the light emitting device is a white light emitting device.

\* \* \* \* \*